(12) United States Patent
Ma et al.

(10) Patent No.: US 11,050,431 B1
(45) Date of Patent: Jun. 29, 2021

(54) SINGLE-ENDED SUCCESSIVE APPROXIMATION REGISTER ANALOG-TO-DIGITAL CONVERTER

(71) Applicants: NCKU Research and Development Foundation, Tainan (TW); Himax Technologies Limited, Tainan (TW)

(72) Inventors: Chao-Hsien Ma, Tainan (TW); Soon-Jyh Chang, Tainan (TW); Hao-Sheng Wu, Tainan (TW)

(73) Assignees: NCKU Research and Development Foundation, Tainan (TW); Himax Technologies Limited, Tainan (TW)

( * ) Notice: Subject to any disclaimer, the term of this patent is extended or adjusted under 35 U.S.C. 154(b) by 0 days.

(21) Appl. No.: 16/989,284

(22) Filed: Aug. 10, 2020

(51) Int. Cl.
*H03M 1/12* (2006.01)
*H03M 1/46* (2006.01)

(52) U.S. Cl.
CPC ......... *H03M 1/462* (2013.01); *H03M 1/1245* (2013.01); *H03M 1/466* (2013.01)

(58) Field of Classification Search
CPC ........ H03M 1/468; H03M 1/466; H03M 1/38; H03M 1/804; H03M 1/1245; H03M 1/46; H03M 1/12; H03M 1/123; H03M 1/06; H03M 1/0682; H03M 1/462; H03M 1/68; H03M 1/145; H03M 1/00; H03M 1/1061; H03M 1/66
USPC ........... 341/118–122, 144, 15, 155, 172, 150
See application file for complete search history.

(56) References Cited

U.S. PATENT DOCUMENTS

| | | | | |
|---|---|---|---|---|
| 8,907,826 B2* | 12/2014 | Hong | ...................... | H03M 1/12 341/118 |
| 8,933,830 B1* | 1/2015 | Jeon | .................... | H03M 1/1023 341/110 |
| 9,680,492 B1* | 6/2017 | Farley | ................. | H03M 1/0863 |
| 2003/0206038 A1* | 11/2003 | Mueck | ................... | H03K 5/249 327/50 |
| 2009/0273501 A1* | 11/2009 | Madhavan | .......... | H03M 1/0845 341/158 |
| 2012/0112938 A1* | 5/2012 | Haneda | ............... | H03M 1/1019 341/110 |
| 2012/0146712 A1* | 6/2012 | Kull | ....................... | G11C 5/147 327/530 |
| 2015/0091746 A1* | 4/2015 | Wang | .................. | H03M 1/1245 341/161 |
| 2015/0194981 A1* | 7/2015 | Tang | ..................... | H03M 1/442 341/172 |
| 2017/0033800 A1* | 2/2017 | Yuan | ................... | H03M 1/1245 |
| 2018/0219558 A1* | 8/2018 | Chiu | ..................... | H03M 1/804 |
| 2019/0253062 A1* | 8/2019 | Zare Hoseini | ........ | H03M 1/144 |

\* cited by examiner

*Primary Examiner* — Linh V Nguyen
(74) *Attorney, Agent, or Firm* — Donald E. Stout; Stout, Uxa & Buyan, LLP

(57) ABSTRACT

A single-ended successive approximation register (SAR) analog-to-digital converter (ADC) includes a first digital-to-analog converter (DAC) having a first capacitor associated with a most significant bit (MSB) of the output code, and a second capacitor associated with other bit or bits of the output code; and a second DAC having a first capacitor associated with a MSB of the output code, and a second capacitor associated with other bit or bits of the output code. A bottom plate of the first capacitor of the second DAC is connected to a negative reference voltage in all phases.

10 Claims, 3 Drawing Sheets

SINGLE-ENDED SUCCESSIVE APPROXIMATION REGISTER ANALOG-TO-DIGITAL CONVERTER

BACKGROUND OF THE INVENTION

1. Field of the Invention

The present invention generally relates to a successive approximation register (SAR) analog-to-digital converter (ADC), and more particularly to switchably operate in a single-ended mode or a differential mode.

2. Description of Related Art

A successive approximation register (SAR) analog-to-digital converter (ADC) is a type of ADC that coverts an analog signal to a digital equivalent of the signal. The SAR ADC performs conversion by comparison and searching through all possible quantization levels to obtain a digital output. The SAR ADC requires less silicon area and power consumption than other ADC architectures.

A differential SAR ADC is one type of SAR ADC that digitizes differential analog input voltages. A single-ended SAR ADC is another type of SAR ADC that digitizes single analog input voltage relative to ground. Single-ended SAR ADC can simplify ADC driver requirement with reduced complexity and lower power dissipation, but has narrower dynamic range and less SNR performance than the differential SAR ADC.

The single-ended SAR ADC commonly suffers inadequate comparison benchmark due to a lack of clear voltage source, and thus ordinarily generates an inaccurate output code. A need has arisen to propose a novel scheme to overcome drawbacks of the conventional single-ended SAR ADC.

SUMMARY OF THE INVENTION

In view of the foregoing, it is an object of the embodiment of the present invention to provide a single-ended successive approximation register (SAR) analog-to-digital converter (ADC) capable of generating a comparison benchmark by self-charge redistribution in a self-based manner.

According to one embodiment, A single-ended successive approximation register (SAR) analog-to-digital converter (ADC) includes a first digital-to-analog converter (DAC), a second DAC, a comparator and a SAR controller. The first DAC is coupled to receive an input voltage via a first sampling switch. The second DAC is coupled to receive a ground voltage via a second sampling switch. The comparator has a positive input node coupled to receive a first output voltage of the first DAC, and a negative input node coupled to receive a second output voltage of the second DAC. The SAR controller controls switching of the first DAC and the second DAC according to a comparison output of the comparator, thereby generating an output code. The first DAC includes a first capacitor associated with a most significant bit (MSB) of the output code, and a second capacitor associated with other bit or bits of the output code; and the second DAC includes a first capacitor associated with a MSB of the output code, and a second capacitor associated with other bit or bits of the output code. A bottom plate of the first capacitor of the second DAC is connected to a negative reference voltage in all phases.

DETAILED DESCRIPTION OF THE INVENTION

Figure 1A:
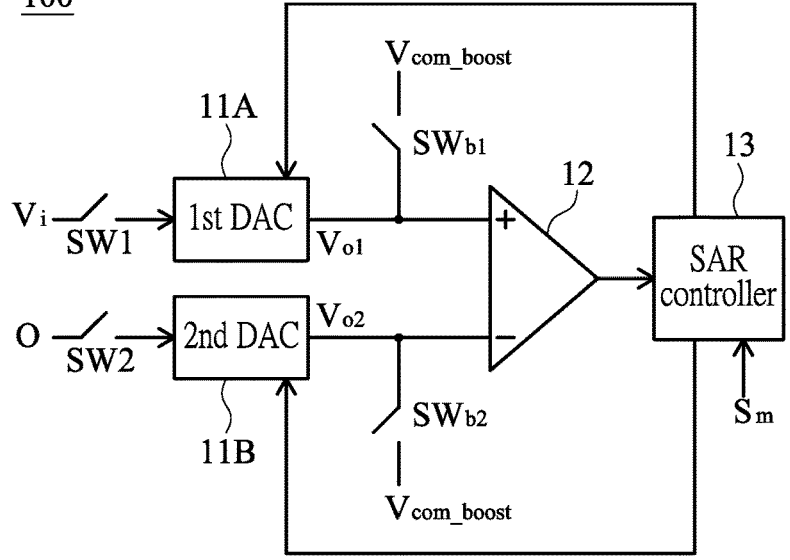
FIG. 1A shows a block diagram illustrating a single-ended successive approximation register (SAR) analog-to-digital converter (ADC) according to one embodiment of the present invention.
Figure 1B:
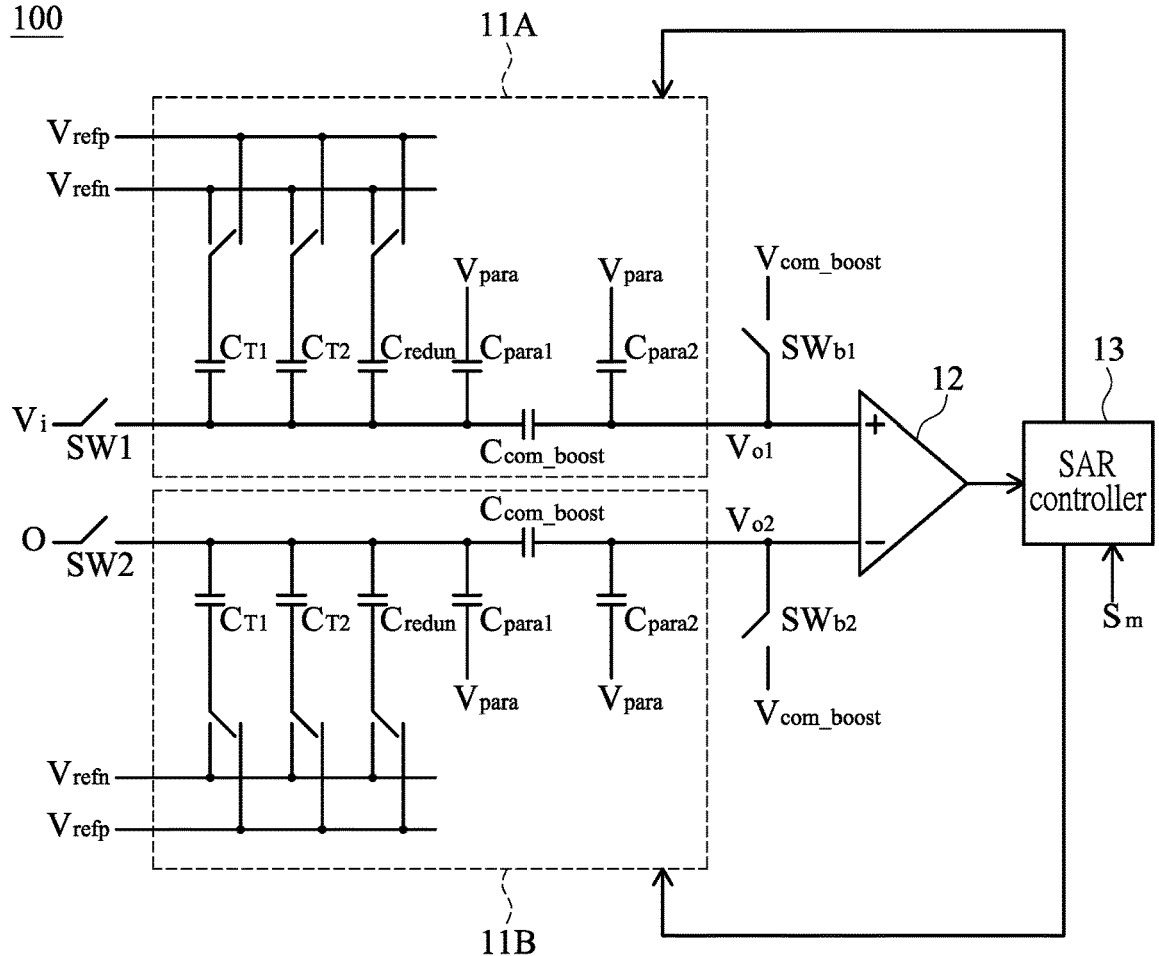
FIG. 1B shows a detailed circuit diagram of the single-ended SAR ADC of FIG. 1A.

FIG. 1A shows a block diagram illustrating a single-ended successive approximation register (SAR) analog-to-digital converter (ADC) 100 according to one embodiment of the present invention, and FIG. 1B shows a detailed circuit diagram of the single-ended SAR ADC 100 of FIG. 1A.

In the embodiment, the single-ended SAR ADC 100 may include a first digital-to-analog converter (DAC) 11A coupled, at its input node, to receive an input voltage $V_i$ via a first sampling switch SW1. The input voltage $V_i$ may swing between a full-scale voltage (e.g., 1 volt) and a ground voltage (e.g., 0 volt). The single-ended SAR ADC 100 may include a second DAC 11B coupled, at its input node, to receive the ground voltage via a second sampling switch SW2.

The single-ended SAR ADC 100 of the embodiment may include a comparator 12 having a positive input node coupled to receive a first output voltage $V_{o1}$ (at an output node) of the first DAC 11A, and a negative input node coupled to receive a second output voltage $V_{o2}$ (at an output node) of the second DAC 11B. The single-ended SAR ADC 100 of the embodiment may include a first boost switch $SW_{b1}$ coupled between the positive input node of the comparator 12 and a common mode boost voltage $V_{com\_boost}$, and a second boost switch $SWb_2$ coupled between the negative input node of the comparator 12 and the common mode boost voltage $V_{com\_boost}$. The first boost switch $SW_{b1}$ and the second boost switch $SW_{b2}$ can raise a common mode voltage for the comparator 12.

The single-ended SAR ADC 100 of the embodiment may include a SAR controller 13 configured to control switching of the first DAC 11A and the second DAC 11B according to a comparison output of the comparator 12, thereby generating an output code from a most significant bit (MSB) to a least significant bit (LSB) in sequence. The SAR controller 13 may enter a single-ended mode or a differential mode according to a mode signal Sm. The single-ended mode is assumed in the following embodiment.

Specifically, the first DAC 11A may include a first capacitor $C_{T1}$, a second capacitor $C_{T2}$ and an (optional) redundant capacitor $C_{redun}$. The first capacitor $C_{T1}$ is associated with the most significant bit (MSB) of the output code, and the second capacitor $C_{T2}$ is associated with other bit(s) of the output code. In the embodiment, the second capacitor $C_{T2}$ may represent a plurality of parallel-connected capacitors collectively. Top plates of the first capacitor $C_{T1}$, the second capacitor $C_{T2}$ and the redundant capacitor $C_{redun}$ may be connected together to the input node of the first DAC 11A. Bottom plates of the first capacitor $C_{T1}$, the second capacitor $C_{T2}$ and the redundant capacitor $C_{redun}$ may be switchably connected to a positive reference voltage $V_{refp}$ (e.g., 1 volt)

and a negative reference voltage $V_{refn}$ (e.g., 0 volt). The first DAC 11A may include a boost capacitor $C_{com\_boost}$ coupled between the input node and the output node of the first DAC 11A for raising the common mode voltage for the comparator 12.

In one embodiment, the first DAC 11A may include a first parasitic capacitor $C_{para1}$ having a top plate coupled to the input node of the first DAC 11A, and a bottom plate coupled to receive a parasitic voltage $V_{para}$. The first DAC 11A may include a second parasitic capacitor $C_{para2}$ having a top plate coupled to the output node of the first DAC 11A, and a bottom plate coupled to receive the parasitic voltage $V_{para}$.

Similarly, the second DAC 11B may include a first capacitor $C_{T1}$, a second capacitor $C_{T2}$ and an (optional) redundant capacitor $C_{redun}$. The first capacitor $C_{T1}$ is associated with the most significant bit (MSB) of the output code, and the second capacitor $C_{T2}$ is associated with other bit(s) of the output code. In the embodiment, the second capacitor $C_{T2}$ may represent a plurality of parallel-connected capacitors collectively. Top plates of the first capacitor $C_{T1}$, the second capacitor $C_{T2}$ and the redundant capacitor $C_{redun}$ are connected together to the input node of the second DAC 11B. Bottom plates of the first capacitor $C_{T1}$, the second capacitor $C_{T2}$ and the redundant capacitor $C_{redun}$ may be switchably connected to a positive reference voltage $V_{refp}$ (e.g., 1 volt) and a negative reference voltage $V_{refn}$ (e.g., 0 volt). The second DAC 11B may include a boost capacitor $C_{com\_boost}$ coupled between the input node and the output node of the second DAC 11B.

In one embodiment, the second DAC 11B may include a first parasitic capacitor $C_{para1}$ having a top plate coupled to the input node of the second DAC 11B, and a bottom plate coupled to receive the parasitic voltage $V_{para}$. The second DAC 11B may include a second parasitic capacitor $C_{para2}$ having a top plate coupled to the output node of the second DAC 11B, and a bottom plate coupled to receive the parasitic voltage $V_{para}$.

Figure 2A:
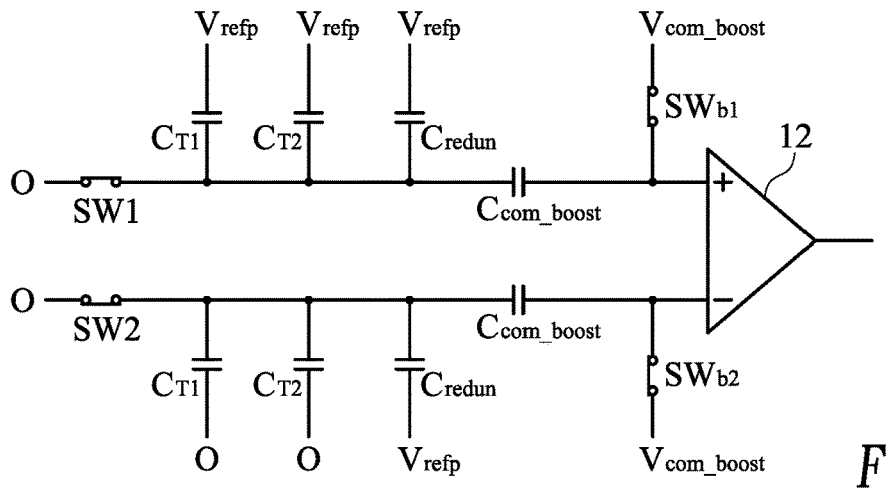
FIG. 2A to FIG. 2C show configurations of the single-ended SAR ADC before sampling, in sampling phase and in top-plate level shifting phase, respectively.
Figure 2B:
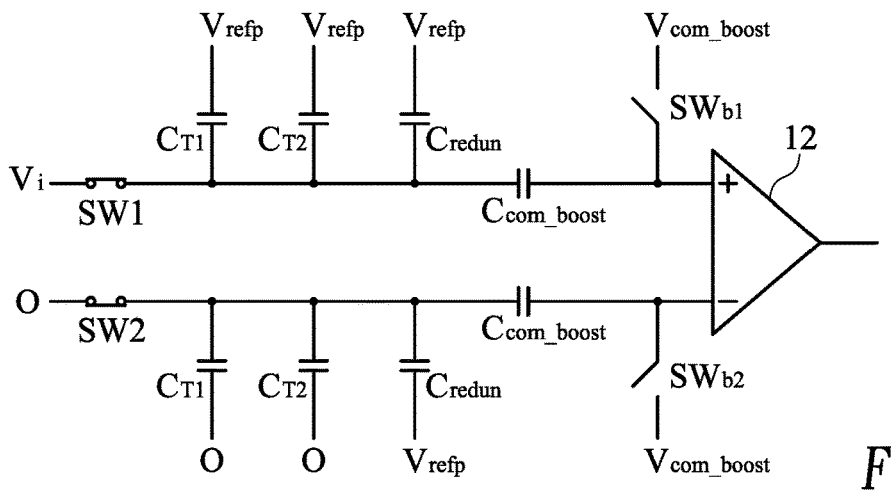
Figure 2C:
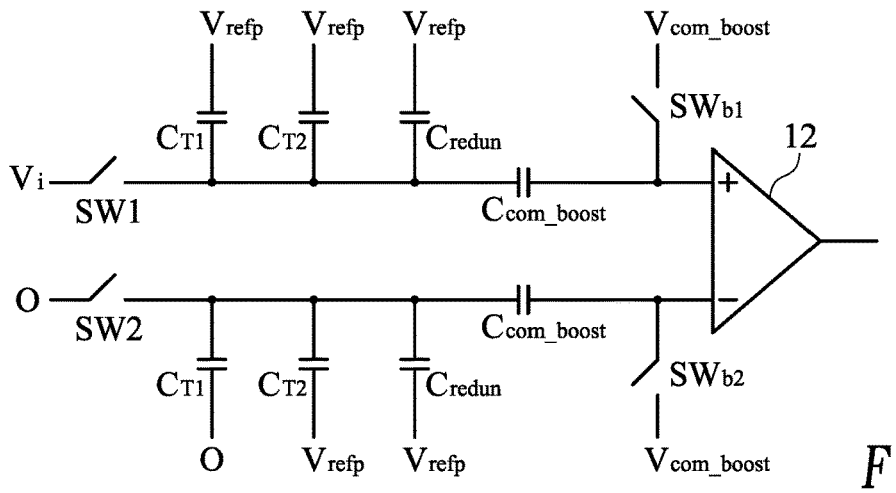
Figure 3:
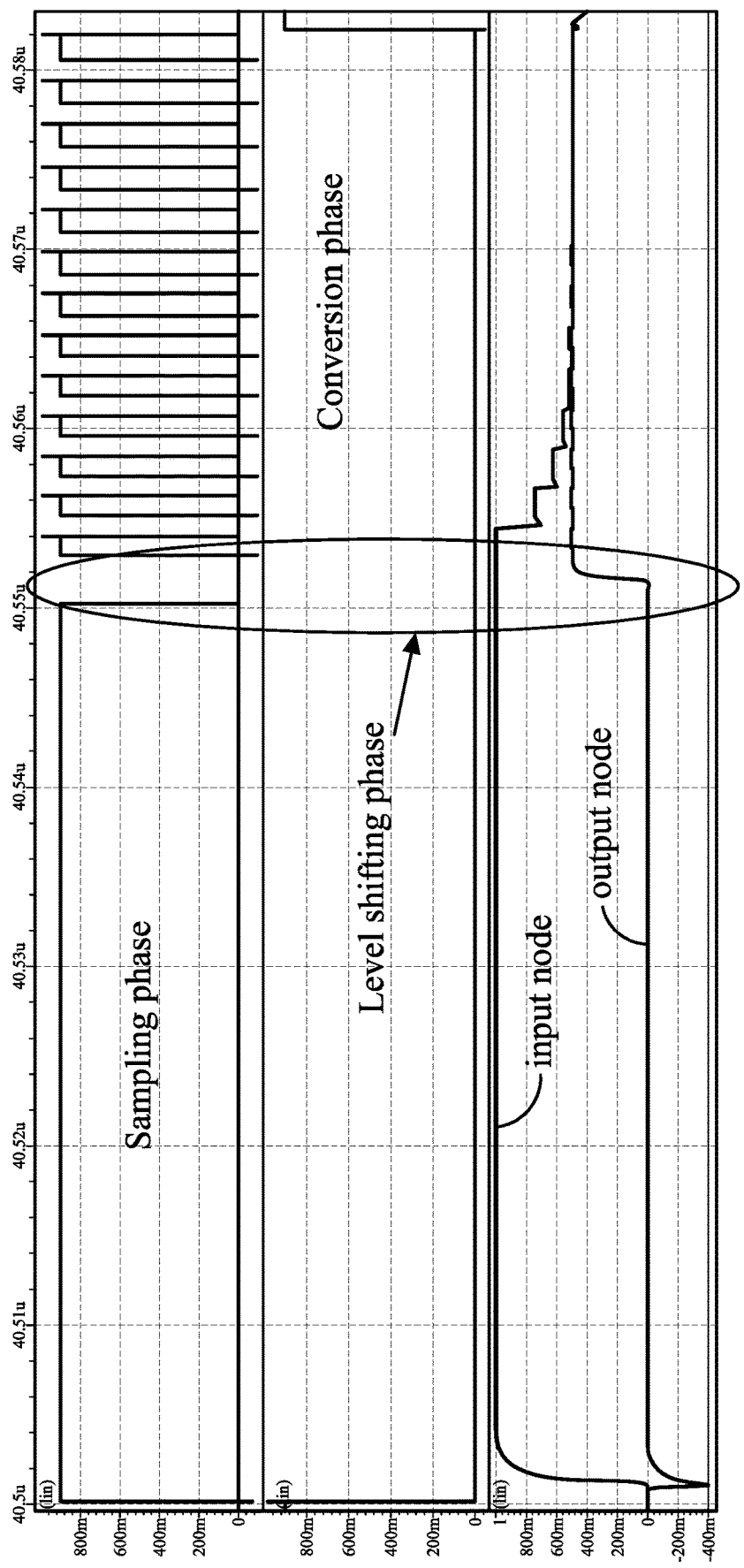
FIG. 3 shows exemplary waveforms at the input node and the output node of the (first/second) DAC.

FIG. 2A to FIG. 2C show configurations of the single-ended SAR ADC 100 before sampling (or at end of previous conversion phase), in sampling phase and in top-plate level shifting phase, respectively. FIG. 3 shows exemplary waveforms at the input node and the output node of the (first/second) DAC 11A/11B.

Specifically, in sampling phase as shown in FIG. 2B, the first sampling switch SW1 and the second sampling switch SW2 are turned on (i.e., closed) to respectively sample the input voltage $V_i$ and the ground voltage, and the first boost switch $SW_{b1}$ and the second boost switch $SW_{b2}$ are turned off (i.e., open). According to one aspect of the embodiment, the bottom plate of the first capacitor $C_{T1}$ of the second DAC 11B may be switchably connected to the negative reference voltage $V_{refn}$ (e.g., 0 volt) in all phases of each cycle.

According to another aspect of the embodiment, in sampling phase, the first capacitor $C_{T1}$, the second capacitor $C_{T2}$ and the redundant capacitor $C_{redun}$ of the first DAC 11A and the redundant capacitor $C_{redun}$ of the second DAC 11B are swichably coupled to receive the positive reference voltage $V_{refp}$, while the second capacitor $C_{T2}$ of the second DAC 11B are switchably coupled to receive the negative reference voltage $V_{refn}$. In one embodiment, the positive reference voltage $V_{refp}$ for an N-bit single-ended SAR ADC 100 may be expressed as $$V_{refp}=(2^{N-1}+C_{para1}+C_{redun}\pm(C_{com\_boost}\|C_{para2}))/2^{N-1}$$

In top-plate level shifting phase as shown in FIG. 2C, the first sampling switch SW1 and the second sampling switch SW2 are turned off (i.e., open), and the first boost switch $SW_{b1}$ and the second boost switch $SW_{b2}$ remain turned off (i.e., open). According to one aspect of the embodiment, in top-plate level shifting phase, the first capacitor $C_{T1}$, the second capacitor $C_{T2}$ and the redundant capacitor $C_{redun}$ of the first DAC 11A and the redundant capacitor $C_{redun}$ of the second DAC 11B remain coupled to receive the positive reference voltage $V_{refp}$, the first capacitor $C_{T1}$ of the second DAC 11B remains coupled to receive the negative reference voltage $V_{refn}$, but the second capacitor $C_{T2}$ of the second DAC 11B is switchably coupled to receive the positive reference voltage $V_{refp}$. The top-plate level shifting phase is followed by conversion phase and pre-charging phase.

According to the embodiment as disclosed above, a comparison benchmark at the input node of the second DAC 11B may be properly generated according to swing of the positive reference voltage $V_{refp}$. Specifically, the comparison benchmark is generated according to voltage division among the first capacitor $C_{T1}$, the second capacitor $C_{T2}$ and the redundant capacitor $C_{redun}$ of the second DAC 11B.

In the differential mode, a differential input voltage (not shown) is sampled by the first DAC 11A and the second DAC 11B via the first sampling switch SW1 and the second sampling switch SW2 respectively, and the bottom plate of the first capacitor $C_{T1}$ of the second DAC 11B is connected to the positive reference voltage $V_{refp}$ or the negative reference voltage $V_{refn}$ according to the control of the SAR controller 13.

Although specific embodiments have been illustrated and described, it will be appreciated by those skilled in the art that various modifications may be made without departing from the scope of the present invention, which is intended to be limited solely by the appended claims.

What is claimed is:

1. A single-ended successive approximation register (SAR) analog-to-digital converter (ADC), comprising:
    a first digital-to-analog converter (DAC) coupled to receive an input voltage via a first sampling switch;
    a second DAC coupled to receive a ground voltage via a second sampling switch;
    a comparator having a positive input node coupled to receive a first output voltage of the first DAC, and a negative input node coupled to receive a second output voltage of the second DAC; and
    a SAR controller that controls switching of the first DAC and the second DAC according to a comparison output of the comparator, thereby generating an output code;
    wherein the first DAC includes a first capacitor associated with a most significant bit (MSB) of the output code, and a second capacitor associated with other bit or bits of the output code; and
    the second DAC includes a first capacitor associated with a MSB of the output code, and a second capacitor associated with other bit or bits of the output code;
    wherein a bottom plate of the first capacitor of the second DAC is connected to a negative reference voltage in all phases;
    wherein the first DAC further comprises a redundant capacitor having a top plate connected to an input node of the first DAC and a bottom plate switchably connected to the positive reference voltage and the negative reference voltage; and the second DAC further comprises a redundant capacitor having a top plate connected to an input node of the second DAC and a bottom plate switchably connected to the positive reference voltage and the negative reference voltage;

wherein in sampling phase the redundant capacitor of the first DAC and the redundant capacitor of the second DAC are switchably coupled to receive the positive reference voltage.

2. The single-ended SAR ADC of claim 1, further comprising:
   a first boost switch coupled between the positive input node of the comparator and a common mode boost voltage; and
   a second boost switch coupled between the negative input node of the comparator and the common mode boost voltage.

3. The single-ended SAR ADC of claim 1, wherein the SAR controller enters a single-ended mode or a differential mode according to a mode signal, wherein in the differential mode, a differential input voltage is sampled by the first DAC and the second DAC via the first sampling switch and the second sampling switch, and the bottom plate of the first capacitor of the second DAC is connected to a positive reference voltage or the negative reference voltage according to control of the SAR controller.

4. The single-ended SAR ADC of claim 1, wherein top plates of the first capacitor and the second capacitor of the first DAC are connected together to the input node of the first DAC, top plates of the first capacitor and the second capacitor of the second DAC are connected together to the input node of the second DAC, bottom plates of the first capacitor and the second capacitor of the first DAC are switchably connected to a positive reference voltage and the negative reference voltage, and bottom plates of the first capacitor and the second capacitor of the second DAC are switchably connected to the positive reference voltage and the negative reference voltage.

5. The single-ended SAR ADC of claim 1, wherein the first DAC further comprises a boost capacitor coupled between the input node and an output node of the first DAC, and the second DAC further comprises a boost capacitor coupled between the input node and an output node of the second DAC.

6. The single-ended SAR ADC of claim 1, wherein the first DAC further comprises:
   a first parasitic capacitor having a top plate coupled to the input node of the first DAC, and a bottom plate coupled to receive a parasitic voltage; and
   a second parasitic capacitor having a top plate coupled to an output node of the first DAC, and a bottom plate coupled to receive the parasitic voltage.

7. A single-ended successive approximation register (SAR) analog-to-digital converter (ADC), comprising:
   a first digital-to-analog converter (DAC) coupled to receive an input voltage via a first sampling switch;
   a second DAC coupled to receive a ground voltage via a second sampling switch;
   a comparator having a positive input node coupled to receive a first output voltage of the first DAC, and a negative input node coupled to receive a second output voltage of the second DAC; and
   a SAR controller that controls switching of the first DAC and the second DAC according to a comparison output of the comparator, thereby generating an output code;
   wherein the first DAC includes a first capacitor associated with a most significant bit (MSB) of the output code, and a second capacitor associated with other bit or bits of the output code; and
   the second DAC includes a first capacitor associated with a MSB of the output code, and a second capacitor associated with other bit or bits of the output code;
   wherein a bottom plate of the first capacitor of the second DAC is connected to a negative reference voltage in all phases;
   wherein in sampling phase the first capacitor and the second capacitor of the first DAC are switchably coupled to receive a positive reference voltage, and the second capacitor of the second DAC is switchably coupled to receive the negative reference voltage;
   wherein the first sampling switch and the second sampling switch are turned on in the sampling phase to respectively sample the input voltage and the ground voltage.

8. The single-ended SAR ADC of claim 7, wherein the sampling phase is followed by top-plate level shifting phase, in which the second capacitor of the second DAC is switchably coupled to receive the positive reference voltage.

9. The single-ended SAR ADC of claim 8, wherein the first sampling switch and the second sampling switch are turned off in the top-plate level shifting phase.

10. The single-ended SAR ADC of claim 1, wherein the sampling phase is followed by top-plate level shifting phase, in which the second capacitor of the second DAC is switchably coupled to receive the positive reference voltage.

* * * * *